United States Patent
Stadler et al.

(10) Patent No.: US 7,083,741 B2
(45) Date of Patent: Aug. 1, 2006

(54) PROCESS AND DEVICE FOR THE WET-CHEMICAL TREATMENT OF SILICON

(75) Inventors: Maximilian Stadler, Haiming (DE); Günter Schwab, Neuötting (DE); Helmut Franke, Burghausen (DE)

(73) Assignee: Siltronic AG, Munich (DE)

( * ) Notice: Subject to any disclaimer, the term of this patent is extended or adjusted under 35 U.S.C. 154(b) by 182 days.

(21) Appl. No.: 10/686,365

(22) Filed: Oct. 15, 2003

(65) Prior Publication Data
US 2004/0129679 A1 Jul. 8, 2004

(30) Foreign Application Priority Data
Oct. 17, 2002 (DE) ................. 102 48 481

(51) Int. Cl.
*H01L 21/00* (2006.01)
*B44C 1/22* (2006.01)

(52) U.S. Cl. .............. 216/93; 216/83; 216/96; 216/99; 438/745; 438/753; 252/79.1; 252/79.2; 252/79.3

(58) Field of Classification Search .......... 216/83, 216/93, 96, 99; 438/745, 753; 252/79.1, 252/79.2, 79.3
See application file for complete search history.

(56) References Cited

U.S. PATENT DOCUMENTS

| 3,767,494 A | * 10/1973 | Muraoka et al. .............. 438/57 |
| 4,980,017 A | * 12/1990 | Kaji et al. .................... 216/93 |
| 5,266,152 A | * 11/1993 | Iwasaki et al. ............... 216/85 |
| 5,843,322 A | 12/1998 | Chandler, Jr. ................ 216/85 |
| 6,444,589 B1 | * 9/2002 | Yoneya et al. ............. 438/745 |
| 6,610,213 B1 | * 8/2003 | Schwab et al. ............... 216/83 |

FOREIGN PATENT DOCUMENTS

DE 2013830 10/1971

OTHER PUBLICATIONS

English Derwent Abstract AN 1971-650625 corresponding to DE 2 013 830.

* cited by examiner

*Primary Examiner*—Shamim Ahmed
(74) *Attorney, Agent, or Firm*—Brooks Kushman P.C.

(57) ABSTRACT

A device and process for the wet-chemical treatment of silicon using an etching liquid that contains water, nitric acid and hydrofluoric acid. The etching liquid is activated by introducing nitrogen oxide ($NO_x$) into the etching liquid, before being used for the wet-chemical treatment of silicon. The device consists of a first vessel in which silicon is subjected to a wet-chemical treatment with the aid of an etching liquid, a second vessel in which fresh etching liquid is held ready, and a connecting line between the first vessel and the second vessel, through which nitrogen oxides ($NO_x$) formed in the first vessel during the wet-chemical treatment are passed to the second vessel.

6 Claims, 1 Drawing Sheet

PROCESS AND DEVICE FOR THE WET-CHEMICAL TREATMENT OF SILICON

BACKGROUND OF THE INVENTION

1. Field of the Invention

The invention relates to a process and device for the wet-chemical treatment of silicon using an etching liquid that contains water, nitric acid and hydrofluoric acid.

2. The Prior Art

One conventional process for the wet-chemical treatment of silicon wafers is etching in an acidic medium. Etching of silicon in an acidic medium takes place in a two-stage reaction:

$$Si+2(O) \rightarrow SiO_2 \qquad (1)$$

$$SiO_2+6HF \rightarrow SiF_6^{2-}+2H_2O+2H^+ \qquad (2)$$

In the first step, silicon is oxidized by an oxidizing agent to form silicon dioxide, which ultimately in the second step is dissolved by hydrofluoric acid. To achieve this reaction, an etching liquid that contains nitric acid (as oxidizing agent) and hydrofluoric acid is generally used. Additives such as acetic acid ($CH_3COOH$) and/or phosphoric acid ($H_3PO_4$) or surfactants are not involved in the reaction but do alter the reaction rate and the roughness of the etched silicon wafer and are therefore often also added.

Due to the water ($H_2O$) formed during the reaction and the consumption of chemicals, the reaction rate (i.e. the etching rate) and the surface roughness of the etched silicon wafer change. By way of example, the presence of water increases the roughness of the etched silicon wafer. Although the reaction rate can be kept constant by stoichiometrically topping up the consumed chemicals (generally by topping up with approximately the same amount as has been consumed by the chemical reactions), the roughness cannot be kept constant. This is because, despite the topping up, the water content of the liquid increases constantly as the amount of dissolved silicon rises.

To counteract this effect, either
1) the etching liquid is discarded and replaced with fresh etching liquid after a certain amount of silicon has been treated, for example after a certain number of silicon wafers have been treated, or
2) more nitric acid and hydrofluoric acid than are stoichiometrically required are topped up, in order to keep the water content at a predetermined level.

Variant 2) has the advantage that in this case the roughness of the treated silicon wafers can be kept constant, but at the same time it requires a considerably increased consumption of chemicals. Moreover, in this process too, a new batch (comprising fresh etching liquid) is required from time to time, for example after maintenance work, and consequently fluctuations in the roughness of the treated silicon wafers cannot be avoided altogether.

In the case of variant 1), differences in roughness are within certain limits inevitable, the roughnesses generally being less than the roughnesses produced in variant 2). Advantages are the reduced consumption of chemicals and considerably reduced chemicals disposal costs.

In the case of variant 1), the consumed etching liquid has to be replaced with fresh etching liquid at regular intervals. In the case of etching with fresh etching liquid, the oxidation of the semiconductor material according to reaction equation (1) is effected exclusively by the nitric acid ($HNO_3$) used:

$$2HNO_3+Si \rightarrow SiO_2+2HNO_2 \qquad (3)$$

However, during subsequent etching runs the nitrous acid ($HNO_2$) formed also acts as an oxidizing agent, nitrous acid having a stronger oxidizing action than nitric acid:

$$4HNO_2+Si \rightarrow SiO_2+2H_2O+4NO \qquad (4)$$

Therefore, the etching rate and consequently also the geometry of the silicon wafers produced by the etching during the first etching run are different than the subsequent runs. This is a serious drawback of variant 1).

This drawback can be avoided if the etching liquid that contains nitric acid and hydrofluoric acid is activated before first being used by the addition of silicon, for example of silicon waste, in which case nitrogen oxides ($NO_x$) and nitrous acid ($HNO_2$) are formed in accordance with reaction equations (3) and (4). A process of this type is described in U.S. Pat. No. 5,843,322. However, this process has various drawbacks: for example, acid is consumed and water generated as early as during the activation. In addition, particularly if silicon waste with a surface area that is not accurately defined is used (in the case of silicon fragments or in the case of multiple use of silicon wafers), it is difficult to meter the quantity of silicon that reacts and therefore the degree of activation.

SUMMARY OF THE INVENTION

It is therefore an object of the invention to activate an etching liquid for the wet-chemical treatment of silicon that contains nitric acid and hydrofluoric acid without adding silicon for the purpose of activation.

This object is achieved by a process for the wet-chemical treatment of silicon using an etching liquid that contains water, nitric acid and hydrofluoric acid. The etching liquid, before being used for the wet-chemical treatment of silicon, is activated by the introduction of nitrogen oxide ($NO_x$) into the etching liquid.

According to the invention, a fresh etching liquid is activated after it has been produced and before it is first used for the wet-chemical treatment of silicon, by the introduction of nitrogen oxide into the etching liquid. In this context, it is preferable to use nitrogen monoxide (NO), nitrogen dioxide ($NO_2$), dinitrogen tetroxide ($N_2O_4$) or mixtures thereof. Nitrogen dioxide is particularly preferred, since in this compound nitrogen is in its highest oxidation state and has the strongest oxidizing action with respect to silicon. When it is being introduced into the etching liquid, nitrogen oxide forms nitrous acid together with the water which is present in the etching liquid, for example in accordance with the following reaction equation:

$$N_2O_4+2NO+2H_2O \rightarrow 4HNO_2 \qquad (5)$$

Therefore, the fresh etching liquid has been activated even before first being used without silicon having to be added. Therefore, the abovementioned drawbacks are avoided. The activation does not consume any of the etching solution. Moreover, no water of reaction is formed, meaning that the water content of the etching solution is not changed by the activation. The etching rates and therefore the geometry of the silicon wafers which have undergone the wet-chemical treatment are constant right from the first wet-chemical treatment of silicon carried out using a fresh, activated etching liquid.

For example, a flow meter is used to meter the nitrogen oxide. A metering means can be eliminated if the nitrogen oxide ($NO_x$) is introduced until the etching liquid is saturated, which is the preferred option. Since the saturation level is reached at an accurately defined concentration under given pressure and temperature conditions and a given composition of the fresh etching liquid, this is the most simple way of setting precisely reproducible concentrations. Therefore, it is preferably ensured that the temperature and composition of the etching mixtures to be activated are always constant. The pressure is generally atmospheric pressure, which for this purpose can be considered approximately constant.

The nitrogen oxide is introduced in the gaseous state as nitrogen monoxide (NO) or nitrogen dioxide ($NO_2$) for example, or in the liquid state as dinitrogen tetroxide ($N_2O_4$). Gaseous nitrogen oxides in gas cylinders are commercially available.

However, it is particularly preferred for the nitrogen oxides to be used to activate fresh etching mixtures which are formed during the wet-chemical treatment of silicon with etching mixtures of this type. In this case, the nitrogen oxides formed in the ongoing production are used to activate fresh etching mixtures, so that there is no need to introduce nitrogen oxides from gas cylinders.

Preferably, therefore, the nitrogen oxide ($No_x$) used for the activation is generated during a wet-chemical treatment of silicon with an etching liquid in a first vessel, the etching liquid containing water, nitric acid and hydrofluoric acid, and the nitrogen oxide ($No_x$) which is formed therefrom being discharged from the first vessel and introduced into a second vessel which holds fresh etching liquid likewise containing water, nitric acid and hydrofluoric acid, in order to activate the fresh etching liquid.

The invention also relates to a device, comprising:

a) a first vessel, in which silicon is subjected to a wet-chemical treatment with the aid of an etching liquid which contains water, nitric acid and hydrofluoric acid, b) a second vessel, in which fresh etching liquid is held ready, and c) a connecting line between the first vessel and the second vessel, through which nitrogen oxides ($No_x$) which are formed in the first vessel during the wet-chemical treatment are passed to the second vessel.

In the context of this preferred embodiment, the nitrogen oxides ($NO_x$) which are formed during the wet-chemical treatment are completely or partly discharged, preferably by suction, from the first vessel, in which the wet-chemical treatment takes place, and are passed into the fresh etching liquid which is present in a second vessel. In this case, the nitrogen oxides react with the water which is present in the fresh etching liquid to form nitrous acid, for example in accordance with reaction equation (5).

The fresh etching liquid which has been prepared in accordance with the invention therefore already contains nitrous acid without silicon having to be added for activation prior to its first use in production. This preferred embodiment of the invention can be operated without any particular outlay in logistical terms, since the nitrogen oxides which are required to activate fresh etching liquid are already produced during etching and also have to be disposed of. In this way, at least some of the nitrogen oxides produced during production can be reused, so that the outlay on disposal is reduced. In addition, there is no need to purchase nitrogen oxides in gas cylinders.

BRIEF DESCRIPTION OF THE DRAWINGS

Other objects and features of the present invention will become apparent from the following detailed description considered in connection with the accompanying drawing. It is to be understood, however, that the drawing is designed as an illustration only and not as a definition of the limits of the invention.

DETAILED DESCRIPTION OF THE PREFERRED EMBODIMENT

Figure 1:
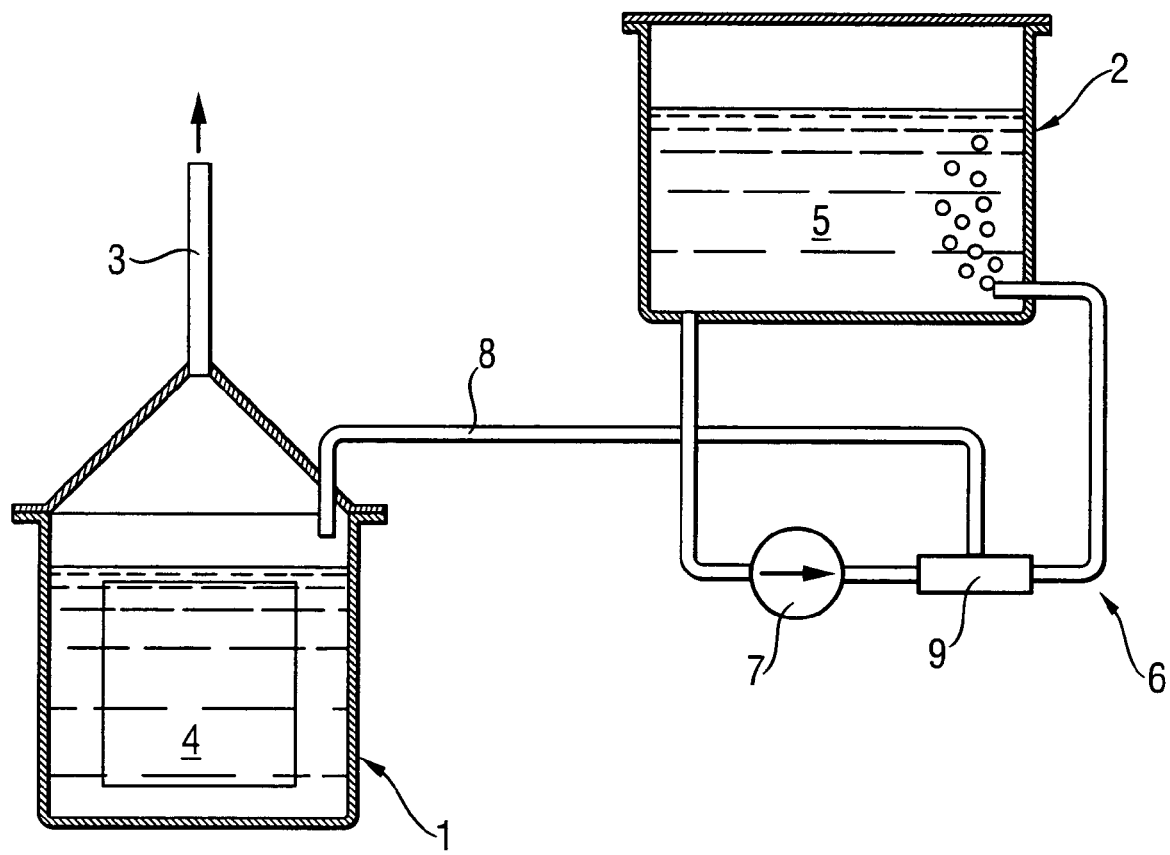
FIG. 1 shows a preferred embodiment of the invention with a connecting line through which nitrogen oxides that are formed in the first vessel during the wet-chemical treatment are passed to the second vessel.

According to the prior art, the nitrogen oxides ($NO_x$) formed during the etching of silicon using etching liquid 4 in vessel 1 are discharged via an off-gas line 3. The second vessel 2 serves as a reservoir for fresh etching liquid 5. In general, the fresh etching liquid is circulated in a circuit 6 with the aid of a pump 7.

According to a preferred embodiment of the invention, the two vessels 1 and 2 in FIG. 1 are connected by a connecting line 8 through which at least some of the nitrogen oxides ($NO_x$) formed during the etching of silicon with the etching liquid 4 in the vessel 1 are passed to the vessel 2. It is preferable for the nitrogen oxides to be sucked out of vessel 1 by means of a pump, particularly preferably a vacuum pump. If appropriate, excess nitrogen oxides continue to be discharged through off-gas line 3.

The nitrogen oxides discharged from first vessel 1 through connecting line 8 are preferably not introduced directly into vessel 2, but rather are passed into circuit 6 which is used to circulate the fresh etching liquid. It is preferable for the nitrogen oxides to be sucked in by a vacuum pump 9 integrated in circuit 6 and then to be fed into circuit 6. It is particularly preferable for vacuum pump 9 to be arranged after circulation pump 7, i.e. downstream of the circulation pump. Circulation pump 7 sucks in fresh etching liquid 5 out of vessel 2. After it has passed through the circulation pump, etching liquid 5 is enriched with nitrogen oxides and introduced back into vessel 2. This arrangement ensures that the circulation pump delivers exclusively liquid, since the nitrogen oxides are only introduced downstream. Vacuum pump 9 operates, for example, in accordance with the principle of a water jet pump. In addition, a valve (not shown) may be integrated in connecting line 8 in order to regulate the gas flow.

It is preferable for vessel 2 also to be equipped with an off-gas line (not shown) via which excess nitrogen oxide is discharged, so that the pressure in the vessel does not rise.

According to a preferred embodiment, the fresh etching liquid of the next batch, which has already been prepared in a different vessel, is activated by introduction of the nitrogen oxides which have been formed by the wet-chemical treatment of production wafers made from silicon and have escaped from the etching liquid which is currently in use. Each subsequent batch can therefore be activated by the ongoing production without an additional logistical outlay being required.

The invention can be used in connection with all processes in which silicon is subjected to wet-chemical treatment with the aid of an etching liquid that contains nitric acid, hydrofluoric acid and water. This may be polycrystalline or single-crystalline silicon in any desired form and surface condition. However, it is preferable for the invention to be employed as part of the wet-chemical treatment of single-crystalline silicon wafers.

Accordingly, while only a few embodiments of the present invention have been shown and described, it is obvious that many changes and modifications may be made thereunto without departing from the spirit and scope of the invention.

What is claimed is:

1. A process for wet-chemical treatment of silicon using an etching liquid that contains water, nitric acid and hydrofluoric acid, the process comprising:
   activating the etching liquid by introducing nitrogen oxide ($NO_x$) into the etching liquid before being used for the wet-chemical treatment of silicon,
wherein the nitrogen oxide ($NO_x$) is generated during a wet-chemical treatment of silicon with an etching liquid in a first vessel, the etching liquid containing water, nitric acid and hydrofluoric acid, and wherein the nitrogen oxide ($NO_x$) that is formed is discharged from the first vessel and introduced into a second vessel that holds fresh etching liquid also containing water, nitric acid and hydrofluoric acid, in order to activate the fresh etching liquid.

2. The process as claimed in claim 1, wherein the nitrogen oxide ($NO_x$) is selected from the group consisting of nitrogen monoxide (NO), nitrogen dioxide ($NO_2$), dinitrogen tetroxide ($N_2O_4$) and mixtures thereof.

3. The process as claimed in claim 1, wherein the nitrogen oxide ($NO_x$)) is introduced until the etching liquid is saturated with the nitrogen oxide.

4. The process as claimed in claim 1, wherein the nitrogen oxides ($NO_x$) which are formed during the wet-chemical treatment are extracted from the first vessel by a pump and are pumped into the second vessel.

5. The process as claimed in claim 1, wherein the nitrogen oxides ($NO_x$) which are discharged from the first vessel are fed into a circuit through which the fresh etching liquid is circulated by means of a pump.

6. The process as claimed in claim 1, wherein the wet-chemical treatment relates to single-crystalline silicon wafers.

* * * * *